(12) United States Patent
Hayashi

(10) Patent No.: US 11,506,361 B2
(45) Date of Patent: Nov. 22, 2022

(54) LIGHT EMITTING DEVICE AND LIGHT SOURCE DEVICE

(71) Applicant: NICHIA CORPORATION, Anan (JP)

(72) Inventor: Hideki Hayashi, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/401,111

(22) Filed: Aug. 12, 2021

(65) Prior Publication Data

US 2022/0057073 A1 Feb. 24, 2022

(30) Foreign Application Priority Data

Aug. 21, 2020 (JP) .............................. JP2020-140324

(51) Int. Cl.
  *F21V 19/00* (2006.01)
  *F21V 23/00* (2015.01)

(52) U.S. Cl.
  CPC ........ *F21V 19/0005* (2013.01); *F21V 23/001* (2013.01)

(58) Field of Classification Search
  CPC ............... F21V 19/0005; F21V 23/001; F21Y 2115/10; H01L 33/486; H01L 33/62; H01L 27/00
  See application file for complete search history.

(56) References Cited

U.S. PATENT DOCUMENTS

| | | | | |
|---|---|---|---|---|
| 7,982,235 | B2* | 7/2011 | Asakawa | H01L 33/62 257/773 |
| 8,847,272 | B2* | 9/2014 | Yamamoto | H01L 33/62 257/E33.056 |
| 10,243,126 | B2* | 3/2019 | Tosuke | H01L 33/483 |
| 2005/0116145 | A1* | 6/2005 | Aki | H01L 31/12 257/E23.114 |
| 2006/0186427 | A1 | 8/2006 | Takine et al. | |
| 2007/0284708 | A1 | 12/2007 | Hanya | |
| 2009/0309122 | A1 | 12/2009 | Kim et al. | |
| 2010/0171144 | A1 | 7/2010 | Kong et al. | |
| 2011/0024313 | A1 | 2/2011 | Nakai | |

(Continued)

FOREIGN PATENT DOCUMENTS

| | | |
|---|---|---|
| JP | 2006-229007 A | 8/2006 |
| JP | 2007-311549 A | 11/2007 |

(Continued)

*Primary Examiner* — Peggy A Neils
(74) *Attorney, Agent, or Firm* — Global IP Counselors, LLP

(57) ABSTRACT

A light emitting device includes at least one light emitting element, a resin member including, a front surface provided with a recess in which the at least one light emitting element is mounted, a back surface, a bottom surface, an upper surface, a first lateral surface, and a second lateral surface; a first lead including a first inner lead portion and a first outer lead portion; and a second lead including a second inner lead portion and a second outer lead portion. Each of the outer lead portions includes a first-outer-lead base portion along the bottom surface, and first and second bent portions which are extended toward the upper surface side. The resin member is not arranged in at least a portion of a region between the second bent portion of the first outer lead portion and the first bent portion of the second outer lead portion.

14 Claims, 11 Drawing Sheets

(56) References Cited

U.S. PATENT DOCUMENTS

| | | |
|---|---|---|
| 2017/0250325 A1 | 8/2017 | Tosuke |
| 2018/0090644 A1 | 3/2018 | Ishikawa et al. |
| 2018/0212124 A1 | 7/2018 | Tosuke et al. |

FOREIGN PATENT DOCUMENTS

| | | |
|---|---|---|
| JP | 2007-329219 A | 12/2007 |
| JP | 2008-252137 A | 10/2008 |
| JP | 2009-302527 A | 12/2009 |
| JP | 2010-067770 A | 3/2010 |
| JP | 2010-087481 A | 4/2010 |
| JP | 2010-530635 A | 9/2010 |
| JP | 2012-253064 A | 12/2012 |
| JP | 2017-157822 A | 9/2017 |
| JP | 2018-006453 A | 1/2018 |
| JP | 2018-061026 A | 4/2018 |
| JP | 2018-117086 A | 7/2018 |
| JP | 2019-104786 A | 6/2019 |
| WO | 2009/130743 A1 | 10/2009 |

\* cited by examiner

LIGHT EMITTING DEVICE AND LIGHT SOURCE DEVICE

CROSS-REFERENCE TO RELATED PATENT APPLICATION

This application claims priority to Japanese Patent Application No. 2020-140324, filed on Aug. 21, 2020. The entire disclosure of Japanese Patent Application No. 2020-140324 is hereby incorporated herein by reference.

BACKGROUND

Technical Field

The present disclosure relates to a light emitting device and a light source device.

Description of Related Art

In a light emitting device configured to emit light in a direction parallel to the mounting surface, which is used for backlighting of liquid crystal display systems required to have a smaller thickness, a resin member may be disposed between positive and negative outer leads to allow efficient dissipation of heat generated from the light emitting device, and to prevent short circuit between the positive and negative outer leads, and also the positive and negative outer leads may be bent along the resin member, to realize a smaller size while maintaining a relatively large outer lead (as shown, for example, in Japanese Patent Application Publication No. 2010-67770).

SUMMARY

It is an object of the present disclosure to provide a light emitting device having improved bonding strength between a light emitting device and a mounting substrate, and to provide a light source device using the light emitting device and the mounting substrate.

The embodiments include the aspects described below.
(1) A light emitting device includes at least one light emitting element, a resin member, a first lead and a second lead. The resin member includes a front surface provided with a recess in which the at least one light emitting element is mounted, a back surface located on an opposite side of the front surface, a bottom surface adjacent to the front surface and the back surface, an upper surface located on an opposite side of the bottom surface, a first lateral surface adjacent to the bottom surface and the upper surface, and a second lateral surface located on an opposite side of the first lateral surface. The first lead includes a first inner lead portion covered by the resin member and a first outer lead portion extending out of the resin member from the bottom surface. The second lead includes a second inner lead portion covered by the resin member and a second outer lead portion extending out of the resin member from the bottom surface. The first outer lead portion includes a first-outer-lead base portion extending along the bottom surface, a first-outer-lead first bent portion extended from the first-outer-lead base portion toward a first lateral surface side and bent toward an upper surface side, and a first-outer-lead second bent portion extending from the first-outer-lead base portion toward a second lateral surface side and bent toward the upper surface side. The second outer lead portion includes a second-outer-lead base portion extending along the bottom surface, a second-outer-lead first bent portion extending from the second-outer-lead base portion toward the first lateral surface side and bent toward the upper surface side, and a second-outer-lead second bent portion extending from the second-outer-lead base portion toward the second lateral surface side and bent toward the upper surface side. The resin member is not arranged in at least a portion of a region between the first-outer-lead second bent portion and the second-outer-lead first bent portion.
(2) A light source device includes: the light emitting device described above; a mounting substrate having a first wiring and a second wiring respectively electrically connected to the first lead and the second lead; the first wiring and the second wiring are spaced apart from each other in a first direction, and the first wiring including, in a bottom view, a first-wiring portion overlapping with the first-outer-lead base portion, a first-wiring first extended portion extending from the first-wiring portion toward the first lateral surface side and overlapping with the first-outer-lead first bent portion, and a first-outer-lead second bent portion extending from the first-wiring portion toward the second lateral surface side and overlapping with the first-outer-lead second bent portion.

According to certain embodiments of the present disclosure, a light emitting device with improved bonding strength to a mounting substrate, and a light source device using the light emitting device and the mounting substrate can be provided.

DETAILED DESCRIPTION OF EMBODIMENTS

Figure 1A:
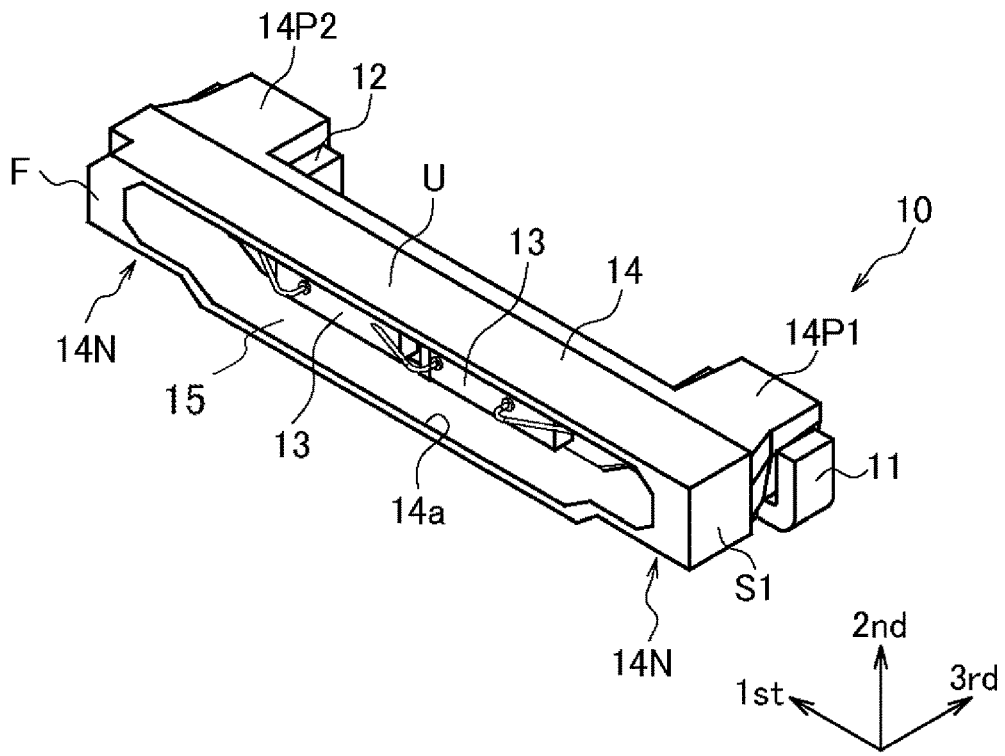
FIG. 1A is a schematic perspective view of a light emitting device according to one embodiment of the present disclosure, viewing a front of the light emitting device obliquely from above.
Figure 1B:
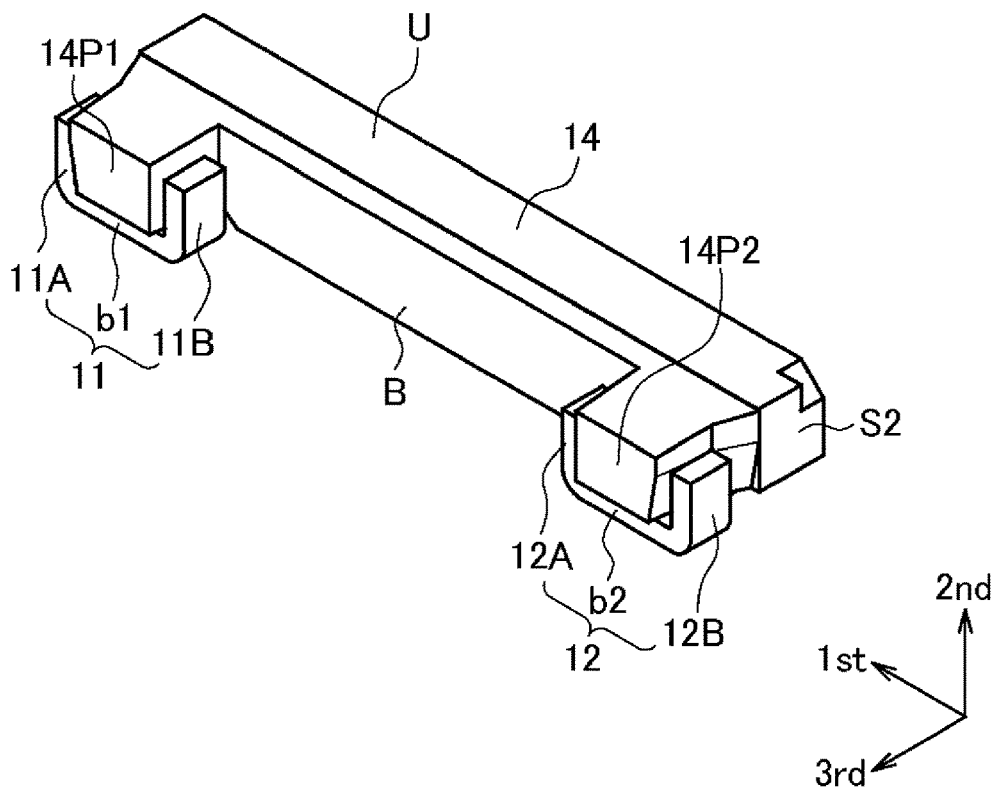
FIG. 1B is a schematic perspective view of the light emitting device of FIG. 1A, viewing a back surface of the light emitting device obliquely from above.

Certain embodiments according to the present disclosure will be described below with reference to the accompanying drawings, as appropriate. It is to be noted that the light emitting device described below is intended for implementing the technical concept of the present invention, and the present invention is not limited to those described below unless otherwise specified. Also description given in one embodiment and/or one example can be applied to other embodiments and/or other examples. Note that, the size, thickness dimensions, positional relationship and the like in the drawings may be exaggerated for the sake of clarity. The arrow in the drawing indicating a direction includes two directions parallel to it.

In the description below, terms which indicate specific directions or locations (for example, "up", "down" and other terms expressing those) may be applied. Those terms are used to express relative directional relationship and positional relationship between the components in a drawing which is referred to for the ease of understanding. When the relative orientation or position relationship expressed by the terms "up", "down", etc. in the referred drawing is the same, it is not necessary a drawing other than those illustrated in the present disclosure or an actual product to have the same configuration as that referenced in the drawing in the present disclosure.

Light Emitting Device

A light emitting device 10 according to a first embodiment of the present disclosure will be described below with reference to FIG. 1A to FIG. 1J. To show the interior structure, a sealing member 15 is shown as a light-transmissive member in FIGS. 1A, 1C, and 1E. The light emitting device 10 includes light emitting elements 13, a resin member 14, a first lead, and a second lead.

The resin member 14 has a front surface F formed with a recess 14a, defined by a bottom surface and sides, in which the light emitting elements 13 are mounted, a back surface B located at an opposite side from the front surface F, a bottom surface BL adjacent to the front surface F and the back surface B, an upper surface U located opposite side from the bottom surface BL, a first lateral surface S1 adjacent to the bottom surface BL and to the upper surface U, and a second lateral surface S2 located at an opposite side from the first lateral surface S1.

The first lead includes a first inner lead portion 11I covered by the resin member 14, and a first outer lead portion 11 extended outside of the bottom surface BL. The first outer lead portion 11 includes the first-outer-lead base portion b1 along the bottom BL, the first-outer-lead first bent portion 11A extended from the first-outer-lead base portion b1 to the first lateral surface S1 side, and the first-outer-lead second bent portion 11B extended from the first-outer-lead base portion b1 to the second lateral surface S2 side and extended to the upper surface side.

The second lead includes a second inner lead portion 12I covered by the resin member 14 and a second outer lead portion 12 extended out of the bottom surface BL. The second outer lead portion 12 includes a second-outer-lead base portion b2 along the bottom surface BL, a second-outer-lead first bent portion 12A extended from the second-outer-lead base portion toward the first lateral surface S1 side and also extends toward the upper surface side, and a second-outer-lead second bent portion 12B extended from the second-outer-lead base portion b2 toward the second lateral surface S2 side and also extended towards the upper surface side.

The resin member is absent (not arranged) in at least a portion of the region between the first-outer-lead second bent portion 11B and the second-outer-lead first bent portion 12A. In other words, there is a region in which the resin member is absent between the first-outer-lead second bent portion 11B and the second-outer-lead first bent portion 12A in a facing direction of the first-outer-lead second bent portion 11B and the second-outer-lead first bent portion 12A. For example, as shown in FIG. 1G, in a first direction, in which the first-outer-lead second bent portion 11B and the second-outer-lead first bent portion 12A are facing each other, the resin member may be absent in the entire region located between the first-outer-lead second bent portion 11B and the second-outer-lead first bent portion 12A.

The bottom surface BL is the mounting surface of the light emitting device 10. In the light emitting device 10, the direction from the first lateral surface S1 to the second lateral surface S2 and vice versa is referred to as the first direction (indicated as 1st in the drawings), and a direction perpendicular to the first direction is referred to as a second direction (indicated as 2nd in the drawings). The direction orthogonal to both the first and second directions will be referred to as a third direction (indicated as 3rd in the drawings).

As such, the first outer lead portion 11 includes the first-outer-lead base portion b1 extended out of the bottom surface BL and extended along the bottom surface BL in the third direction, the first-outer-lead first bent portion 11A extended from the first-outer-lead base portion b1 at a back surface side of the first-outer-lead base portion b1 toward (first direction) the first lateral surface S1 side and extended toward (second direction) the upper surface U side, and the first-outer-lead second bent portion 11B extended out of the first-outer-lead base portion b1 and extended toward (first direction) the second lateral surface S2 side and also extended toward (second direction) the upper surface U side.

The second outer lead portion 12 includes the second-outer-lead base portion b2 extended out of the bottom surface BL and extended along the bottom surface BL in the third direction, the second-outer-lead first bent portion 12A extended from the second-outer-lead base portion b2 at a back surface side of the second-outer-lead base portion b2 toward (first direction) the first lateral surface side and extended toward (second direction) the upper surface U side, and the second-outer-lead second bent portion 12B extended out of the second-outer-lead base portion b2 and extended toward (second direction) the second lateral surface S2 side and also extended toward (second direction) the upper surface U side.

With this configuration, the first outer lead portion and the second outer lead portion each having a U-shape in the back view are disposed spaced apart from each other, and a space formed by an absence of the resin member is provided between the first-outer-lead second bent portion 11B and the second-outer-lead first bent portion 12A, particularly around the first-outer-lead second bent portion 11B and the second-outer-lead first bent portion 12A. This allows fillets to be formed on both lateral surfaces of the outer lead portion and the second outer lead portion of the U-shape when the light emitting device is bonded to the mounting substrate using a bonding member such as a solder. That is, the absence of the bonding member allows for rising up of the bonding member onto the both lateral surfaces of the outer lead portion and the second outer lead portion that may be limited or prevented by a presence of the resin member. As a result, the bonding strength between the light emitting device and the mounting substrate can be improved. Forming each of the outer lead portion and the second outer lead portion in a U-shape can increase their surface areas, thus ensuring heat dissipation.

Figure 1C:
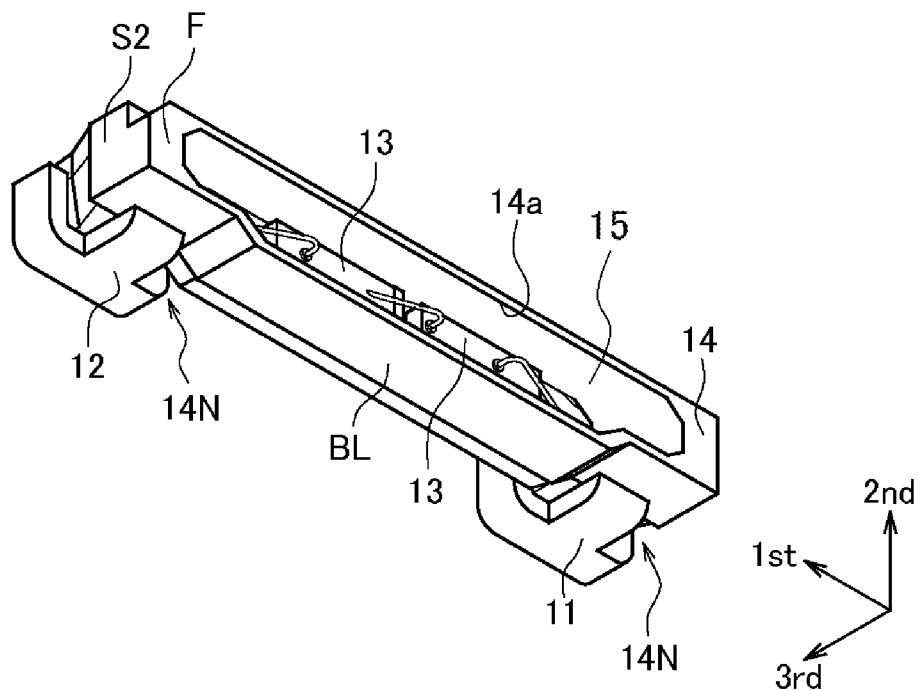
FIG. 1C is a schematic perspective view of the light emitting device of FIG. 1A, viewing the front of the light emitting device obliquely from below.
Figure 1D:
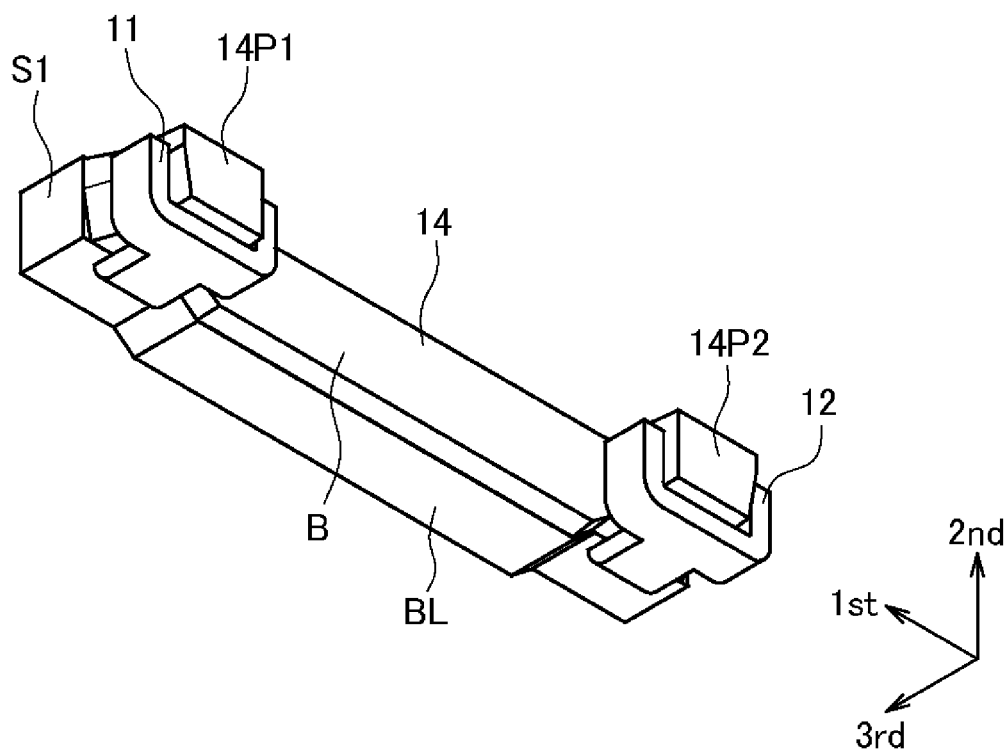
FIG. 1D is a schematic perspective view of the light emitting device of FIG. 1A, viewing the back surface of the light emitting device obliquely from below.
Figure 1E:
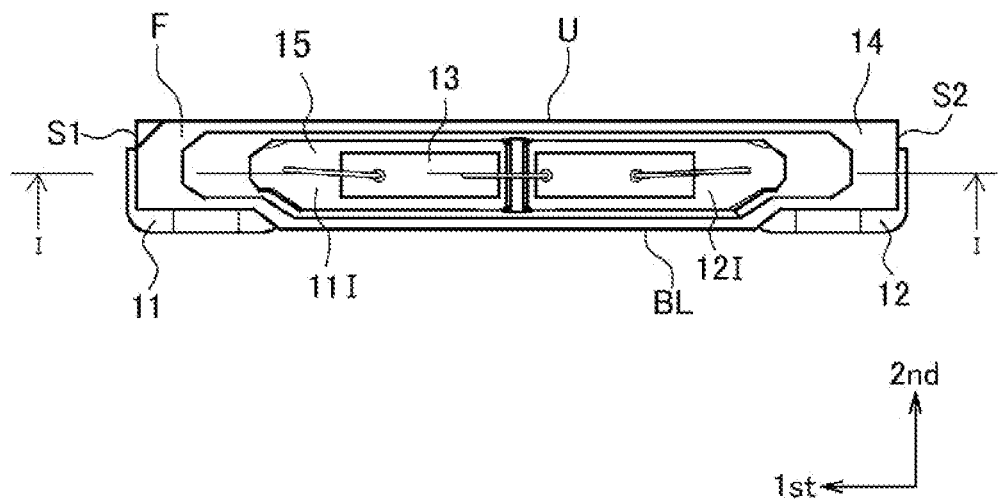
FIG. 1E is a schematic front view of the light emitting device of FIG. 1A.
Figure 1F:
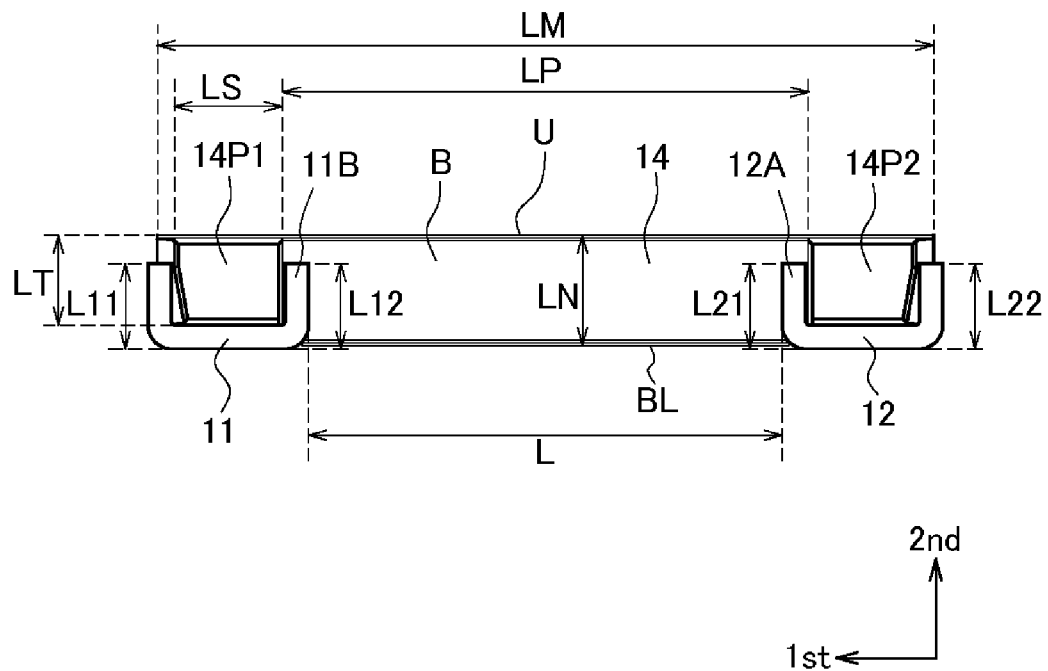
FIG. 1F is a schematic back view of the light emitting device of FIG. 1A.
Figure 1G:
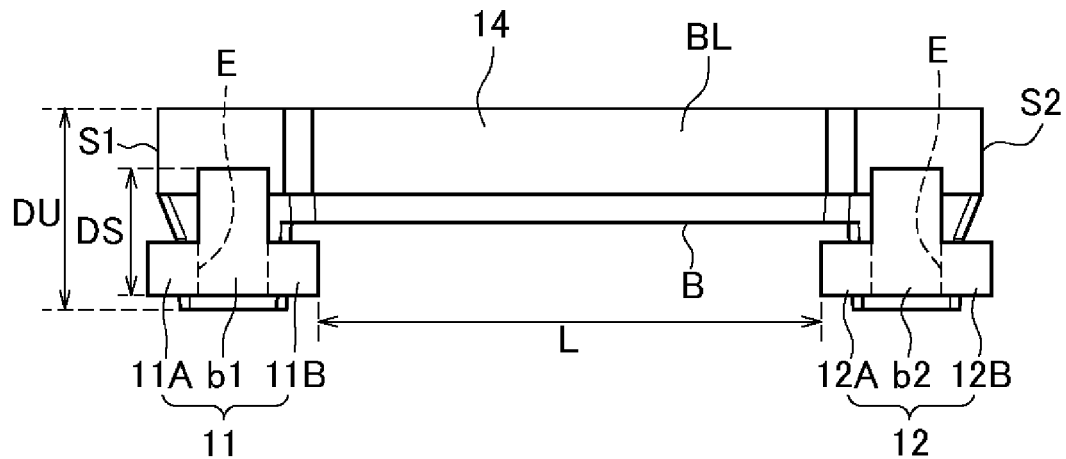
FIG. 1G is a schematic bottom view of the light emitting device of FIG. 1A.
Figure 2:
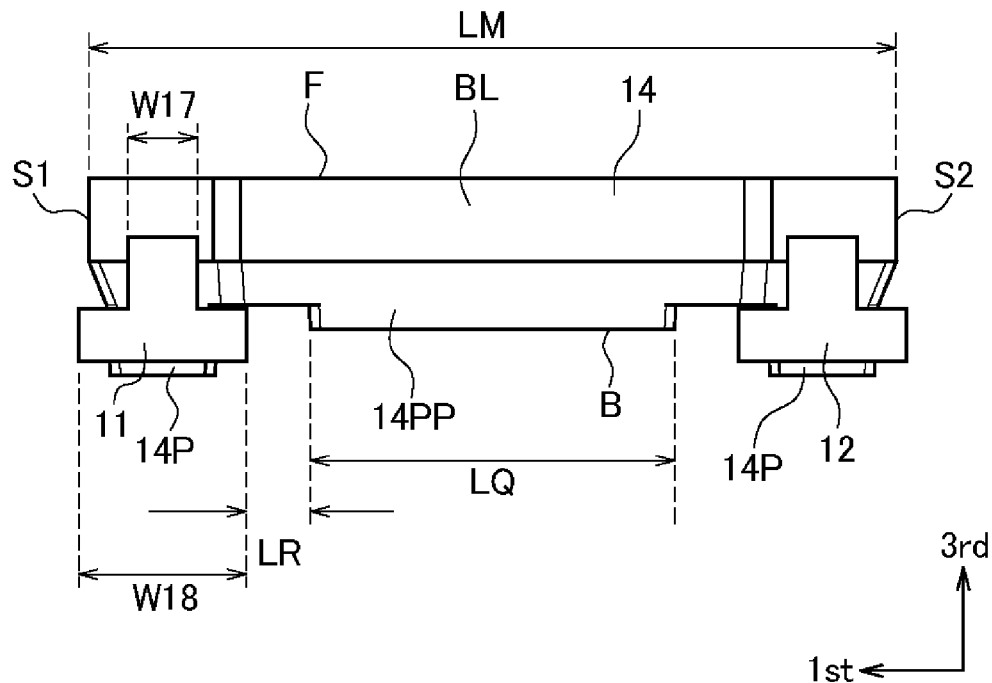
FIG. 2 is a schematic bottom view of a light emitting device of Variational Example 1 of one embodiment according to the present disclosure.

As shown in FIG. 2, the resin member 14 may be located in a portion of the region between the first-outer-lead second bent portion 11B and the second-outer-lead first bent portion 12A in the first direction and may not be located in a portion of other region between the first-outer-lead second bent portion 11B and the second-outer-lead first bent portion 12A in the first direction. In particular, as shown in FIG. 1G etc., it is preferable that the resin member 14 is not located in the region between the first-outer-lead second bent portion 11B and the second-outer-lead first bent portion 12A. In other words, it is preferable that the resin member is absent, leaving only a layer of air in all the regions between the first-outer-lead second bent portion 11B and the second-outer-lead first bent portion 12A which are facing each other in the first direction. With this arrangement, the space between the first-outer-lead second bent portion 11B and the second-outer-lead first bent portion 12A, which is absent of the resin member, can be increased, which can increase a volume of the bonding member in contact with the first-outer-lead second bent portion 11B and with the second-outer-lead first bent portion 12A. Accordingly, the bonding strength of the light emitting device and the mounting substrate can be further improved.

Light Emitting Element 13

The light-emitting element 13 is a semiconductor element configured to emit light upon being applied with voltage, and any appropriate semiconductor element known in the art can be employed. Examples of the light emitting element include an LED chip. The light emitting element includes at least a semiconductor layer, and in many cases further includes an element substrate. The light emitting element includes element electrodes. The element electrodes can be made of gold, silver, tin, platinum, rhodium, titanium, aluminum, tungsten, palladium, nickel, or an alloy thereof. For the material of the semiconductor, a nitride-based semiconductor can be preferably used. The nitride-based semiconductor can be represented by $In_xAl_yGa_{1-x-y}N$ ($0 \leq x$, $0 \leq y$, $x+y \leq 1$). Other materials such as InAlGaAs-based semiconductors, InAlGaP-based semiconductors, zinc sulfide, zinc selenide, silicon carbide, or the like can also be used. The element substrate of the light emitting element may generally be a growth substrate that allows growth of semiconductor crystals that constitute the semiconductor layer, but may also be a bonding substrate to be bonded to the semiconductor layer that is separated from the growth substrate.

A single light emitting element 13 may be mounted in a single light emitting device, or a plurality of light emitting elements 13 may be mounted in a single light emitting device. In order to improve luminous intensity, a plurality of light emitting elements configured to emit light of the same color may be used in a combination. In order to improve color reproducibility, a plurality of light emitting elements configured to emit light of different colors may be used in a combination corresponding to the RGB components.

Figure 1H:
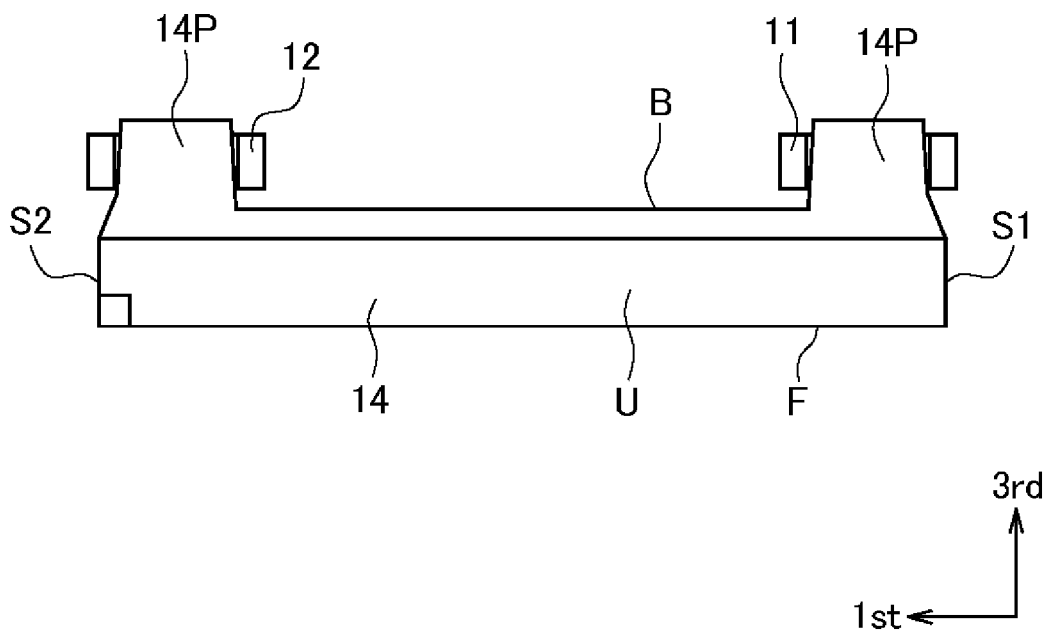
FIG. 1H is a schematic top view of the light emitting device of FIG. 1A.
Figure 1I:
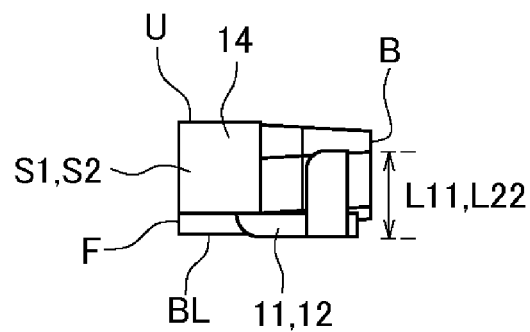
FIG. 1I is a schematic a schematic side view of the light emitting device of FIG. 1A.
Figure 1J:
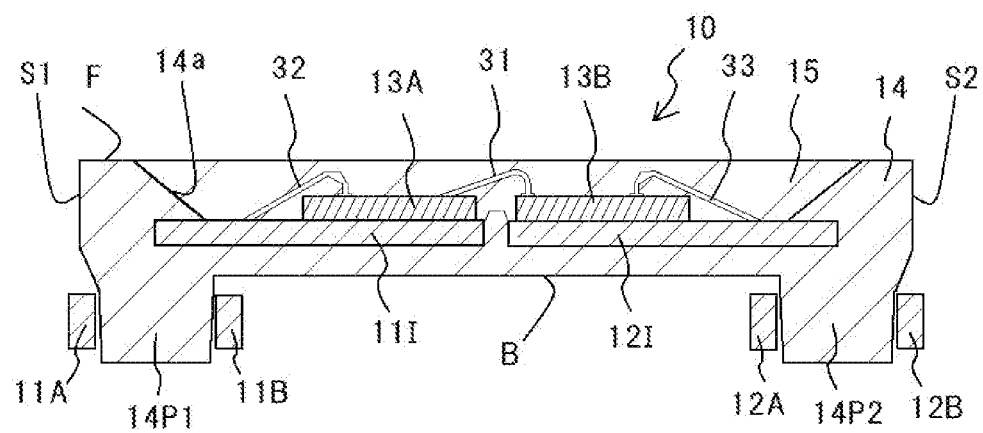
FIG. 1J is a schematic cross-sectional view taken along line I-I of FIG. 1E.

As shown in FIG. 1J, when the light emitting device 10 includes two light emitting elements of a first light emitting element 13A and a second light emitting element 13B, the light emitting device 10 may include a first wire 31, a second wire 32, and a third wire 33. The first wire 31 electrically connects a first element electrode of the first light emitting element 13A and a first element electrode of the second light emitting element 13B. The second wire 32 electrically connects a second element electrode of the first light emitting element 13A and a first inner lead portion 11I. The third wire 33 electrically connects a second element electrode of the second light emitting element 13B and a second inner lead portion 12I. Accordingly, the first light emitting element 13A and the second light emitting element 13B can be connected in series. In the present specification, the first wire 31, the second wire 32 and/or the third wire 33 may be referred to as "wires".

For the material of the wires, a metal such as gold, copper, silver, aluminum, or palladium, or an alloy of one or more of those can be used. When the material of the wires contains gold, the wires having good thermal resistance and less likely to break due to stress caused by the sealing member or the like can be obtained. When the material of the wires contains silver, the wire that shows a high optical reflectance can be obtained, thereby improving the light-emitting efficiency of the light emitting device. The wires may contain both gold and silver. When the wires contain both gold and silver, the wires may have a silver content in a range of 15 to 20%, in a range of 45 to 55%, in a range of 70 to 90%, or in a range of 95 to 99%. In particular, when the silver content is in a range of 45 to 55%, sulfidation can be reduced while obtaining a high optical reflectance. The wires can have an appropriate diameter, which can be in a range of 5 to 50 μm. The diameter of the wires is more preferably in a range of 10 to 40 μm, further preferably in a range of 15 to 30 μm.

When the first wire 31, the second wire 32, and the third wire 33 contain both gold and silver, the first wire 31, the second wire 32, and the third wire 33 each may have a silver content either the same or different. When the first wire 31 overlaps the first inner lead portion 11I and the second inner lead portion 12I in a front view, it is preferable that the first wire has a silver content lower than that of the second wire 32 and of the third wire 33. In other words, in a front view, when the first wire 31 overlaps the first inner lead portion 11I and the second inner lead portion 12I, it is preferable that the first wire has a gold content higher than that of the second wire 32 and of the third wire 33. Because of the difference in the coefficient of thermal expansion between the first and second leads and the resin member, the wire bridging the first lead and the second lead is generally subjected to significant stress when the light emitting device expands or shrinks due to heat. Therefore, raising the gold content of the first wire 31, which is overlapped with the first inner lead portion 11I and the second inner lead portion 12I in the front view, to a higher gold content than that of the second wire 32 and of the third wire 33, can reduce or prevent breaking of the first wire 31. Also, raising the silver content of the second wire 32 and of the third wire 33, which are not overlapped with the first inner lead portion 11I and with the second inner lead portion 12I, to a higher silver content of the first wire 31, can improve the light extraction efficiency of the light emitting device. For example, it is preferable that the first wire has a silver content in a range of 75 to 85% and also has a gold content in a range of 15 to 25%, and the second wire and the third wire each has a silver content in a range of 95 to 99% and also has a gold content in a range of 1 to 5%.

As shown in FIGS. 1A, 1C, and 1E, through a bonding member, each of the light emitting elements 13 is mounted on the surface of the first inner lead portion 11I, the second inner lead portion 12I and/or the resin member 14, which are located on the upward-facing surface of the recess 14a of the resin member. In this case, each of the light emitting elements may be mounted in a flip-chip manner or a face-up manner through wire bonding using wires. The wires are configured to electrically connect the positive electrode and negative electrode of each of the light emitting elements with the first inner lead portion 11I and the second inner lead portion 12I respectively. Examples of the bonding member used in the case of face-up mounting include a bonding member such as an epoxy resin or a silicone resin. Examples of the bonding member used in the case of flip-chip mounting include a solder such as Au—Sn eutectic solder material, a brazing material such as a low-melting-point metal, an electrically conductive paste. In addition, in the case of a light-emitting element that has an electrically conductive substrate (such as GaAs) and has element electrodes on both sides, for example, an electrically conductive paste formed of silver, gold, palladium, or the like can be used. For an element electrode that is not facing the substrate may be wired-bonded using a wire.

In addition to the light-emitting element(s), a protective element or an electronic component may be disposed in the light-emitting device. Such a protective element or an electronic component may be disposed in the recess 14a where the light emitting element(s) 13 is disposed, or may be mounted in a different recess formed in the resin member 14. Such a protective element or an electronic component may be disposed on the bottom surface of the inner lead portion on which the light emitting element is disposed, and covered by a resin material to form an integrated part with the resin member 14. Either a single or a plurality of protective elements or electronic components may be used. Any appropriate known protective element(s) or electronic component(s) used for a light emitting device can be employed.

Resin Member 14

As shown in FIGS. 1A to 1I, the resin member 14 includes a front surface F, a back surface B located opposite from the front surface F, a bottom surface BL adjacent to the front surface F and the back surface B, an upper surface U located opposite from the bottom surface BL, a first lateral surface S1 adjacent to the bottom surface BL and the upper surface U, and a second lateral surface S2 located opposite from the first lateral surface S1. The front surface F is formed with a recess 14a recessed toward the back surface B side to dispose the light emitting elements.

The resin member 14 is a support body configured to integrally support leads that to be connected to respective electrodes of each of the light emitting elements. In addition, the resin member 14 is configured to protect the light emitting elements etc., from the external environment.

The resin member 14 may have any appropriate general outer shape, such as a columnar shape, a truncated shape, a spherical shape, an oval shape, or a shape in which those are partially or collectively combined. Among those, the resin member 14 preferably has a general outer shape of a columnar shape or a columnar shape with irregular surface structures. The resin member 14 may have an outer shape, in which, for example, each of the front surface F, the back surface B, the bottom surface BL, and the upper surface U may be formed partially with a recessed portion or protruding portion in a second direction and/or a third direction, but have a narrow elongated shape in the first direction.

As shown in FIG. 1H, the resin member 14 preferably has two protruded portions 14P located on each side of the back surface B in the first direction in a top view. The protruded portions 14P are preferably a first protruded portion 14P1 surrounded by a first-outer-lead base portion b1, a first-outer-lead first bent portion 11A, and a first-outer-lead second bent portion 11B of the first outer lead portion 11, and a second protruded portion 14P2 surrounded by a second-outer-lead base portion b2, a second-outer-lead first bent portion 12A, and a second-outer-lead second bent portion 12B of the second outer lead portion 12. In the first direction, it is preferable that the smallest length (LP in FIG. 1F) between the first protruded portion 14P1 and the second protruded portion 14P2 in the first direction is, for example, in a range of $1/3$ to $9/10$ of the maximum length of the resin member 14. When the smallest length (LP in FIG. 1F) between the first protruded portion 14P1 and the second protruded portion 14P2 in the first direction is at least $1/3$ of the greatest length (LM in FIG. 1F) of the resin member 14 in the first direction, it allows a greater distance between the first-outer-lead second bent portion 11B and the second-outer-lead first bent portion 12A. This arrangement allows avoiding occurrence of short-circuit between the first lead and the second lead, thus providing a light emitting device of high reliability. More specifically, the smallest length LP between the first protruded portion 14P1 and the second protruded portion 14P2 in the first direction is preferably 50 μm or greater. When the smallest length LP between the first protruded portion 14P1 and the second protruded portion 14P2 in the first direction is $9/10$ or smaller than the greatest length LM of the resin member 14 in the first direction, it allows a smaller length of the resin member 14 in the first direction. This arrangement allows for smaller dimensions of the light emitting device in the first direction. It is preferable that the greatest lengths (LS in FIG. 1F) of the first protruded portion 14P1 and the second protruded portion 14P2 in the first direction are, for example, in a range of $1/20$ to $1/3$ of the greatest length (LM in FIG. 1F) of the resin member 14 in the first direction. When the greatest lengths (LS in FIG. 1F) of the first protruded portion 14P1 and the second protruded portion 14P2 are at least $1/20$ of the greatest length LM of the resin member 14, mechanical strength of the first protruded portion 14P1 and the second protruded portion 14P2 can be improved. When the greatest lengths LS of the first protruded portion 14P1 and the second protruded portion 14P2 (LS in FIG. 1F) in the first direction are at $1/3$ or less than the length of the resin member 14, it allows increasing the smallest length LP between the first protruded portion 14P1 and the second protruded portion 14P2 in the first direction. With this arrangement, the distance between the first-outer-lead second bent portion 11B and the second-outer-lead first bent portion 12A in the first direction can be increased, which facilitates avoiding occurrence of short-circuit between the first lead and the second lead. It is preferable that the greatest lengths (LT in FIG. 1F) of the first protruded portion 14P1 and the second protruded portion 14P2 in the second direction are in a range of 1/10 to 9/10 of the greatest length (LN in FIG. 1F) of the resin member 14 in the second direction. When the greatest lengths LT of the first protruded portion 14P1 and the second protruded portion 14P2 in the second direction are at least 1/10 of the greatest length of the resin member 14 LN in the second direction, mechanical strength of the first protruded portion 14P1 and the second protruded portion 14P2 can be improved. When the greatest length LT of the first protruded portion 14P1 in the second direction is 9/10 or less of the greatest length LN of the resin member 14, the greatest length LT of the first protruded portion 14P1 can be reduced. This arrangement allows for smaller dimensions of the light emitting device in the second direction.

When the back surface B includes the first protruded portion and the second protruded portion, as shown in FIG. 1G, a portion of the back surface B located between the first protruded portion and the second protruded portion can be flat, or as shown in FIG. 2, a portion of the back surface B located between the first protruded portion and the second protruded portion may be formed with a partially protruded third protruded portion 14PP. In this case, it is preferable that the tip of the third protruded portion 14PP is located closer to the front surface F side than the tip of the first protruded portion 14P1 and the tip of the second protruded portion 14P2 located at the back surface B. With this arrangement, the volume of the third protruded portion 14PP located in a region between the first-outer-lead second bent portion and the second-outer-lead first bent portion 12A can be reduced. Accordingly, the volume of the bonding member to be in contact with each of the first-outer-lead second bent portion and the second-outer-lead first bent portion can be increased. Accordingly, bonding strength between the light emitting device and the mounting substrate can be improved. The greatest length (LQ in FIG. 2) of the third protruded portion 14PP in the first direction can be, for example, in a range of 1/20 to 1/3 of the greatest length (LM in FIG. 2) of the resin member 14 in the first direction. In the first direction, the greatest length LQ of the third protruded portion 14PP is at least 1/20 of the greatest length LM of the resin member 14, allowing increasing the mechanical strength of the third protruded portion 14PP. Increasing the mechanical strength of the third protruded portion 14PP can reduce or prevent breaking or chipping of the resin member. In the first direction, the greatest length LQ of the third protruded portion 14PP is 1/3 or less of the greatest length LM of the resin member 14, which allows a reduction in the volume of the third protruded portion 14PP located in a region between the first-outer-lead second bent portion 11B and the second-outer-lead first bent portion 12A. Accordingly, the volume of the bonding member to be in contact with each of the first-outer-lead second bent portion and the second-outer-lead first bent portion can be increased. The greatest length of the third protruded portion 14PP in the second direction is preferably in a range of 1/15 to 1/4 of the greatest length of the resin member 14 in the second direction. In the second direction, the greatest length of the third protruded portion 14PP is at least 1/15 of the greatest length of the resin member 14, which allows increasing the mechanical strength of the third protruded portion 14PP. In the second direction, the maximum length of the third protruded portion 14PP is 1/4 or less of the greatest length of the resin member 14, which allows reducing the volume of the third protruded portion 14PP located in the region between the first-outer-lead second bent portion 11B. Accordingly, the volume of the bonding member to be in contact with each of the first-outer-lead second bent portion and the second-outer-lead first bent portion can be increased.

As shown in FIG. 1A etc., it is preferable that the resin member 14 defines a recessed portion recessing from a lateral surface to a bottom surface BL at each end portion in the first direction in a front view, each being configured to accommodate the first outer lead portion 11 and the second outer lead portion 12 respectively. The lengths of the recessed portion 14N in the first direction, the second direction, and the third direction are preferably substantially the same as the width, the thickness, etc., of the first outer lead portion 11 and the second outer lead portion 12, which can be determined appropriately.

In the front view, all or portion of each of the first lateral surface S1 and the second lateral surface S1 may be perpendicular to the upper surface U and/or the bottom surface BL, or as shown in FIG. 1H, in the top view, all or portion of each of the first lateral surface S1 and the second lateral surface S1 may be inclined from the front surface U toward the back surface B, that is, inclined inward in the third direction.

It is preferable to arrange the recessed portion 14N, the protruded portions 14P, and the third protruded portion 14PP in line symmetry with a straight line passing parallel to the second direction through the midpoint of the resin member in the first direction. When the third protruded portion 14PP corresponds to the gate of the mold for the resin member 14, the arrangement above can facilitate filling the recessed portions 14N, the protruded portions 14P, and the third protruded portion 14PP with the resin member before it has been cured. This can facilitate reduction of occurrence of unfilled part in the resin member.

For the resin member 14, for example, a thermoplastic resin or a thermosetting resin can be used. Examples of the thermoplastic resin include a polyphthalamide resin, a liquid crystal polymer, and a polybutylene terephthalate (PBT). When the sealing member disposed in the recess 14a contains an epoxy resin or a silicone resin, a semi-crystalline polymer resin is preferably used for the resin member 14. A semi-crystalline polymer resin has good adhesion to an epoxy resin and a silicone resin, so that the use of a semi-crystalline polymer resin for the resin member 14 can improve adhesion to the sealing member. Examples of the thermosetting resin include an epoxy resin, a modified epoxy resin, a silicone resin, a modified silicone resin, and unsaturated polyester resin. The resin member may contain a light-reflective member such as titanium oxide. With this arrangement, a light emitting device with good visibility i.e., high contrast between a light-emitting region and a non-light-emitting region can be obtained.

First Lead and Second Lead

As shown in FIGS. 1A to 1I, each of the first lead and the second lead includes the first inner lead portion 11I and the second inner lead portion 12I that are covered by the resin member 14, and the first outer lead portion 11 and the second outer lead portion 12 that are extended out of the bottom surface BL of the resin member 14.

A portion of each of the first inner lead portion 11I and the second inner lead portion 12I is exposed at the bottom surface of the recess 14a. The first inner lead portion 11I and the second inner lead portion 12I are disposed adjacent to each other along the first direction. The first inner lead portion 11I and the second inner lead portion 12I are configured to supply the light emitting elements with the electricity applied from the outside through the first outer lead portion 11 and the second outer lead portion 12.

The first outer lead portion 11 and the second outer lead portion 12 respectively extended from the first inner lead portion 11I and the second inner lead portion 12I, and are extended outward from the bottom surface BL of resin member 14. The first outer lead portion 11 and the second outer lead portion 12 are configured to supply external electricity to each corresponding one of the light emitting elements. The first outer lead portion 11 and the second outer lead portion 12 are disposed spaced apart from each and adjacent to each other in the first direction.

For example, as shown in FIGS. 1F, 1G, etc., the first outer lead portion 11 includes the first-outer-lead base portion b1, the first-outer-lead first bent portion 11A, and the first-outer-lead second bent portion 11B. The first-outer-lead base portion b1 is a portion located along the bottom surface BL and extended in the third direction. The first-outer-lead first bent portion 11A is a portion extended from the first-outer-lead base portion b1 toward the first lateral surface S1 side in the first direction. It is preferable that an outer end of the first-outer-lead base portion b1 located at the back surface B side and an outer end of the first-outer-lead first bent portion 11A are located on an imaginary single straight line extending in the first direction. With this arrangement, the volume of the first-outer-lead first bent portion 11A can be easily increased when the first outer lead portion 11 has a constant length in the third direction, than when the outer end of the first-outer-lead base portion b1 and the outer end of the first-outer-lead first bent portion 11A are not located on an imaginary single straight line extending in the first direction. Accordingly, heat dissipation performance of the light emitting device can be improved. The first-outer-lead first bent portion 11A includes a portion further extended from the portion extended in the first direction toward the upper surface U side in the second direction. In other words, the first-outer-lead first bent portion 11A includes a portion further bent from the portion extended in the first direction, toward the upper surface U side in the second direction. The first-outer-lead second bent portion 11B is a portion extended from the first-outer-lead base portion b1 toward the second lateral surface S2 side in the first direction, and further extended toward the upper surface U side in the second direction. In other words, the first-outer-lead second bent portion 11B includes a portion extended from the first-outer-lead base portion b1 toward the second lateral surface S2 side in the first direction, and further bent toward the upper surface U side in the second direction. It is preferable that the outer end of the first-outer-lead base portion b1 located at the back surface B side and an outer end of the first-outer-lead second bent portion 11B are located on an imaginary single straight line extended in the first direction. With this arrangement, the volume of the first-outer-lead second bent portion 11B can be easily increased.

The second outer lead portion 12 includes the second-outer-lead base portion b2, a second-outer-lead first bent portion 12A, and a second-outer-lead second bent portion 12B. The second-outer-lead base portion b2 is a portion extended along the bottom surface BL in the third direction. The second-outer-lead first bent portion 12A is extended from the second-outer-lead base portion b2 toward the first lateral surface S1 side in the first direction, and further extended toward the upper surface U side in the second direction. In other words, the second-outer-lead first bent portion 12A includes a portion extended from the second-outer-lead base portion b2 toward the first lateral surface S1 side in the first direction and further bent toward the upper surface U side in the second direction. It is preferable that the outer end of the second-outer-lead base portion b2 located at the back surface B side and the outer end of the second-outer-lead first bent portion 12A are on an imaginary single straight line extended in the first direction. With this arrangement, a volume of the second-outer-lead first bent portion 12A can be easily increased. The second-outer-lead second bent portion 12B is extended from the second-outer-lead base portion b2 toward the second lateral surface S2 side in the first direction and further extended toward the upper surface U side in the second direction. In other words, the second-outer-lead second bent portion 12B includes a portion extended from the second-outer-lead base portion b2 toward the second lateral surface S2 side in the first direction and further bent toward the upper surface U side in the second direction. It is desirable that the outer end of the second-outer-lead base portion b2 located at the back surface B side and the outer end of the second-outer-lead second bent portion 12B are located on an imaginary single straight line extended in the first direction. Accordingly, the volume of the second-outer-lead second bent portion 12B can be easily increased.

As described above, having the first outer lead portion 11 and the second outer lead portion 12 in a bent shape allows formation of a fillet of a bonding member on the first-outer-lead first bent portion 11A, the first-outer-lead second bent portion, the second-outer-lead first bent portion 12A, and the second outer lead portion second when the light emitting device is bonded on a mounting substrate by using a bonding member such as a solder. As a result, the bonding strength between the light emitting device and the mounting substrate can be improved. Further, as described above, even when the resin member 14 includes a third protruded portion 14PP, as shown in FIG. 2, it is possible to allow to define a space absent of the resin member around the first-outer-lead second bent portion 11B and the second-outer-lead first bent portion 12A, accommodating the distance LR between the first-outer-lead second bent portion 11B and the third protruded portion 14PP. This arrangement allows the bonding member to rise up along the first-outer-lead first bent portion 11A, the first-outer-lead second bent portion 11B, the second-outer-lead first bent portion 12A, and the second-outer-lead second bent portion 12B, without being prevented by the resin member. This increase the volume of the bonding member, which can improve the mechanical strength between the light emitting device and the mounting substrate. Furthermore, the extension of the first and second outer leads in the second direction makes it easier to decrease the dimensions of the light emitting device in the first direction. Further, extended the first and second outer leads in the second direction allows to increase the volumes of the first and second outer leads, accordingly, the heat dissipation of the light emitting device can be improved.

The first and second outer lead portions 11 and 12 are preferably have the same size, more preferably have the same shape and size. With this arrangement, the first outer lead portion 11 and the second outer lead portion 12 can be bonded to the mounting substrate through the bonding member of similar or the same amount. This makes it easier to achieve the same or similar thicknesses of the bonding member located under the first-outer-lead base portion b1 and the second-outer-lead base portion b2, which allows for thickness of the bonding member under the second-outer-lead base portion b2, thus preventing tilting of the light emitting device in the third direction. In the present specification, the term "same size" allows for dimensional variations within ±5%. In a similar manner, in the present specification, the term "same shape" allows for dimensional variations within ±5%.

As shown in FIG. 1F, the greatest height L11 of the first-outer-lead first bent portion 11A from the bottom surface BL side to the upper surface U side may be the same as the greatest height L12 of the first-outer-lead second bent portion 11B from the bottom surface BL side to the upper surface U side. In other words, in a back view, the first-outer-lead second bent portion 11A and the first-outer-lead second bent portion 11B may have the same greatest length in the second direction, i.e., L11=L12. This allows a uniform force to be applied to the first-outer-lead first bent portion 11A and the first-outer-lead second bent portion 11B in the operation of bending the leads. As a result, deviation in the shapes of the first-outer-lead first bent portion 11A and the first-outer-lead second bent portion 11B can be reduced, and bending operation can be facilitated. In this case, the greatest height L21 of the second-outer-lead first bent portion 12A from the bottom surface BL side to the upper surface U side and the greatest height L22 of second-outer-lead second bent portion 12B from the bottom surface BL side to the upper surface U side are preferably the same, i.e., L21=L22. This allows a uniform force to be applied to the second-outer-lead first bent portion 12A and the second-outer-lead second bent portion 12B in the operation of bending the leads. It is preferable that the greatest heights L11, L12, L21, and L22 are, for example, ½ to 9/10 of the length of the resin portion 14 in the second direction.

When the greatest heights L11, L12, L21, and L22 are at least a half the length of the resin member 14 in the second direction, a greater volume is allowed for each of the first-outer-lead first bent portion 11A, the first-outer-lead second bent portion 11B, the second-outer-lead first bent portion 12A, and the second-outer-lead second bent portion 12B. This will increase the volume of the bonding member covering the first-outer-lead first bent portion 11A, the first-outer-lead second bent portion 11B, the second-outer-lead first bent portion 12A, and the second-outer-lead second bent portion 12B, respectively, thereby improving the bonding strength of the light emitting device and the mounting substrate. For example, the greatest heights L11, L12, L21, and L22 are preferably 50 μm or greater. When the greatest heights L11, L12, L21, and L22 are 9/10 or less of the length of the resin member 14 in of the second direction, the dimensions of the light emitting device in the second direction can be reduced.

When bent the first-outer-lead first bent portion 11A and the first-outer-lead second bent portion 11B to hold both lateral sides of the first protruded portion 14P1 of the resin member 14 in between, the first-outer-lead first bent portion 11A and the first-outer-lead second bent portion 11B can be bent along the first protruded portion 14P1. Likewise, when bent the second-outer-lead first bent portion 12A and the second-outer-lead second bent portion 12B to hold both lateral sides of the second protruded portion 14P2 of the resin member 14 in between, the second-outer-lead first bent portion 12A and the second-outer-lead second bent portion 12B can be bent along the second protruded portion 14P2. With this arrangement, deviation in the distance between the first-outer-lead second bent portion 11B and the second-outer-lead first bent portion 12A can be reduced, such that occurrence of short circuit in the light emitting device can be easily reduced. In addition, deviation in the shapes of the first-outer-lead first bent portion 11A, the first-outer-lead second bent portion 11B, the second-outer-lead first bent portion 12A, and the second-outer-lead second bent portion 12B can be reduced by bent the first-outer-lead first bent portion 11A and the first-outer-lead second bent portion 11B along the first protruded portion 14P1 and bent the second-outer-lead first bent portion 12A and the second-outer-lead second bent portion 12B along the second protruded portion 14P2, which can provide a high-quality light emitting device.

As shown in FIG. 1F, the smallest distance L (i.e., the length in the first direction) between the first-outer-lead second bent portion 11B and the second-outer-lead first bent portion 12A can be equal to or greater than the sum of the greatest height L12 of the first-outer-lead second bent portion L12 from the bottom surface B1 side to the upper surface U side and the greatest height L21 of the second-outer-lead first bent portion 12A from the bottom surface B1 side to the upper surface U side. In other words, it can be set to L12+L21≤L. In this case, the smallest distance L between the first-outer-lead second bent portion 11B and the second-outer-lead first bent portion 12A can be equal to or greater than the sum of the greatest height L11 of the first-outer-lead first bent portion 11A and the greatest height L22 of the second-outer-lead second bent portion 12B from the bottom surface BL side to the upper surface U side. In other words, L11+L22≤L is preferable. This arrangement will increase the smallest distance L between the first-outer-lead second bent portion 11B and the second-outer-lead first bent portion 12A such that even when the bent angles of the first-outer-lead second bent portion 11B and/or the second-outer-lead first bent portion 12A deviates, the first-outer-lead second bent portion 11B and the second-outer-lead first bent portion 12A can be prevented from coming in contact with each other. This facilitates preventing occurrence of short circuit in the light emitting device. It can also be set to L11+L12≤L, L21+L22≤L. After the first-outer-lead first bent portion 11A and the first-outer-lead second bent portion are formed, the greatest length (W17 in FIG. 2 and FIG. 5D) of the first-outer-lead base portion b1 in the first direction is preferably in a range of ⅕ to ⅘ of the greatest length (W18 in FIG. 2 and FIG. 5D) of the first outer lead portion 11 in the first direction. The greatest length W17 of the first-outer-lead base portion b1 in the first direction being ⅕ or greater of the greatest length of the first outer lead portion 11 in the first direction can increase the mechanical strength of the first-outer-lead base portion b1. When the greatest length of the first-outer-lead base portion b1 of the first outer lead portion 11 in the first direction is ⅘ or less of the greatest length of the first outer lead portion 11 in the first direction, the lengths of the first-outer-lead base portion and/or the first-outer-lead second bent portion in the first direction can be increased. This will increase the volume of the bonding members disposed on the first-outer-lead first bent portion and the first-outer-lead second bent portion respectively, thereby improving the bonding strength of the light emitting device and the mounting substrate. It is also preferable that the greatest length (DS in FIG. 1G) of the first outer lead portion 11 in the third direction is in a range of ½ to ⅘ of the greatest length (DU in FIG. 1G) of the resin member 14 inclusive of the protruded portion in the third direction. In the third direction, when the greatest length of the first outer lead portion 11 is at least ½ of the greatest length of the resin member 14, the dimensions of the first outer lead portion 11 can be increased. This allows increasing the area of contact between the bonding member and the first outer lead portion 11 when the light emitting device is bonded to the mounting substrate through a bonding member. This improves the bonding strength of the light emitting device and the mounting substrate. With the greatest length of the first outer lead portion 11 in the third direction ⅘ or less of the greatest length of resin member 14, the dimensions of the light emitting device in the third direction.

The first and second leads are electrically conductive members that are configured to be connected to positive and negative electrodes of the light emitting element respectively, and each has a substantially plate-like shape, but a waveform plate or a plate with uneven surface may also be employed. The thickness can be appropriately set as long as it performs its function, it may be uniform or partially thick or thin. It is preferable to use a material having a relatively high thermal conductivity. By forming the first and second leads with such a material, it is possible to efficiently release the heat generated by the light emitting element. For example, materials with thermal conductivity of 200 W/(m·K) or greater, with relatively large mechanical strength, or with ease of punching press processing or etching are preferably employed. Specific examples of such materials include metals such as copper, aluminum, gold, silver, tungsten, iron, and nickel, alloys such as iron-nickel alloy, phosphorous bronze, etc., that are used with a single-layer or a multi-layer structure. It is preferable that the surfaces of the first and second leads have a reflective plating to efficiently extract light emitted from the light emitting element that to be mounted. The gloss of the plated surfaces can be, for example, in a range of 0.2 to 2.0, taking into account the light extraction efficiency and manufacturing cost. In addition to the first outer lead portion 11 and the second outer lead portion 12, a total of three or more outer lead portions may be employed. With such outer lead portions, heat dissipation can be further improved.

Sealing Member 15

It is preferable that in the light emitting device, a sealing member 15 is disposed in the recess to enclose the light emitting element. The sealing material 15 formed with a light transmissive resin, etc. Examples of such a resin include a thermoplastic resin and a thermosetting resin, as illustrated in resin member. The sealing member 15 may contain a light diffusing material, a fluorescent material, etc. Examples of the light diffusing material include silicon oxide, aluminum oxide, zirconium oxide, and zinc oxide. As a fluorescent material, any appropriate fluorescent material known in the art can be used. The sealing member 15 preferably has an optical transmittance to the emission peak wavelength of the light emitting element of 60% or greater, 70% or greater, more preferably 80% or greater.

Variational Example 1 of Light Emitting Device

Figure 3:
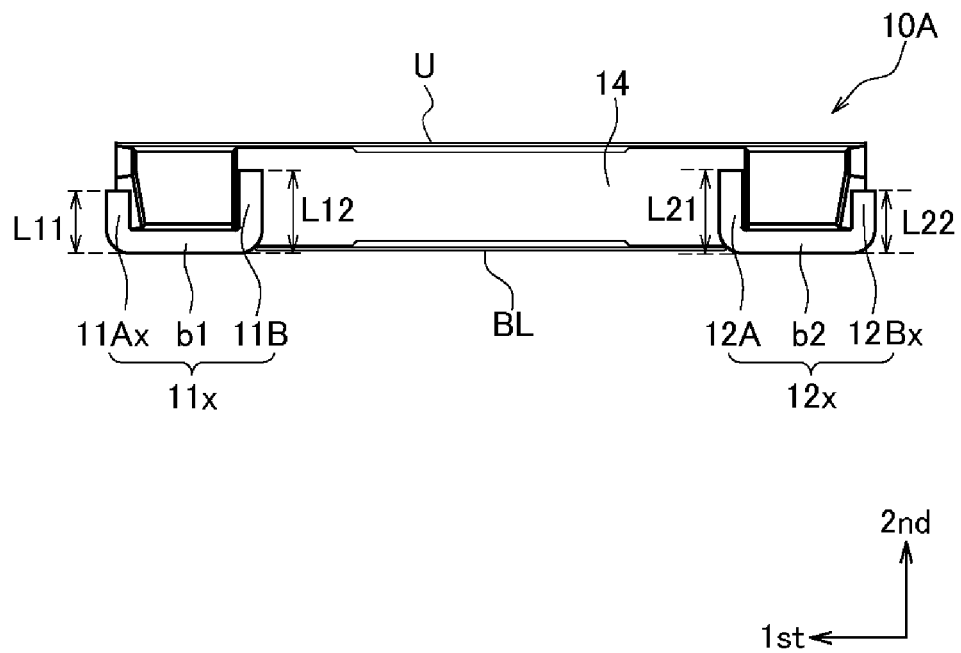
FIG. 3 is a schematic back view of a light emitting device of Variational Example 2 of one embodiment according to the present disclosure.

In the first outer lead portion 11, the greatest height L11 of the first-outer-lead first bent portion 11A from the bottom surface BL side to the upper surface U side and the greatest height L12 of the first-outer-lead second bent portion 11B from the bottom surface BL side to the upper surface U side may be different. In other words, the greatest height L11 of the first-outer-lead first bent portion 11A in the second direction may be different from the greatest height L12 of the first-outer-lead second bent portion 11B in the second direction may differ. For example, it may be L11>L12, and as shown in FIG. 3, in the first outer lead portion 11x, the greatest height L11 of the first-outer-lead first bent portion 11Ax in the second direction and the greatest height L12 of the first-outer-lead second bent portion 11B may be set to L11<L12. In this case, the greatest height L21 of the second-outer-lead first bent portion 12A from the bottom surface B1 to the upper surface U side is preferably smaller than the greatest height L22 of the second-outer-lead second bent portion 12Bx from the bottom surface BL side to the upper surface U side. In other words, it is preferable to satisfy L21>L22. It is preferable that the second outer lead portion also has a structure similar to those of the first outer lead portion. This configuration allows a reduction of the dimensions of the fast lead and the second lead in the first direction for a single light emitting device, in a collective state of the lead frame before singulating into each of the light emitting devices. For example, in the lead frame 111 shown in FIG. 4, the greatest height of the first-outer-lead first bent portion can be reduced from Lp to Lq. This arrangement can reduce a sum of lengths Lr of the first lead and the second lead for a single light emitting device. This further allows an increase in the number of first lead and the second lead corresponding to a single light emitting device obtained from a single lead frame before singulating into individual light emitting devices.

Light Source Device

As shown in FIGS. 5A to 5D, the light source device 20 according to the present embodiment includes the light emitting device 10 described above and a mounting substrate 23 including a first wiring 21 and a second wiring 22. The light emitting device 10 is mounted on the mounting substrate 23, with the bottom surface BL as the mounting surface.

The first, second, and third directions of the light emitting device 10 when mounted on the mounting substrate are indicated as the first, second, and third directions of the mounting substrate and the light source device, respectively. Thus, the mounting substrate 23 includes a surface area in the first direction and the second direction, and the thickness direction of mounting substrate 23 is the second direction.

Mounting Substrate

Figure 5A:
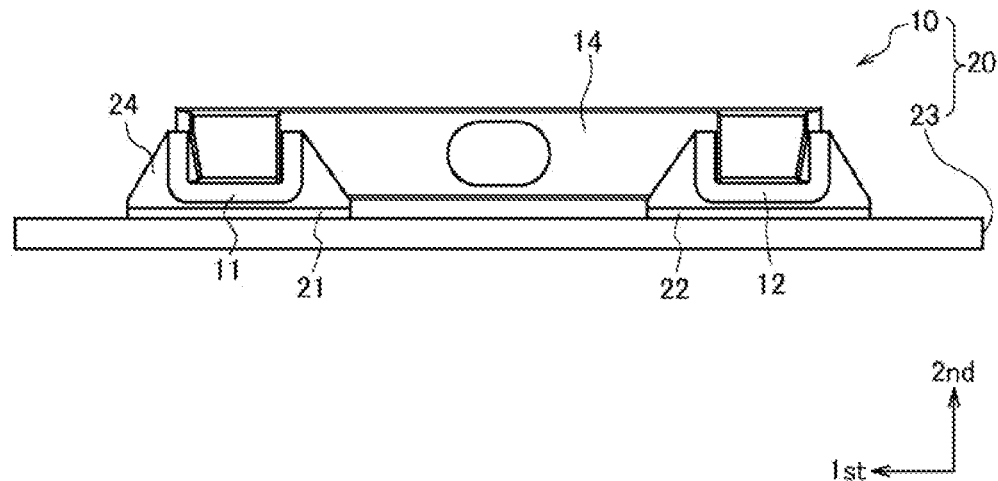
FIG. 5A is a schematic back view of a light source device according to one embodiment of the present disclosure.
Figure 5B:
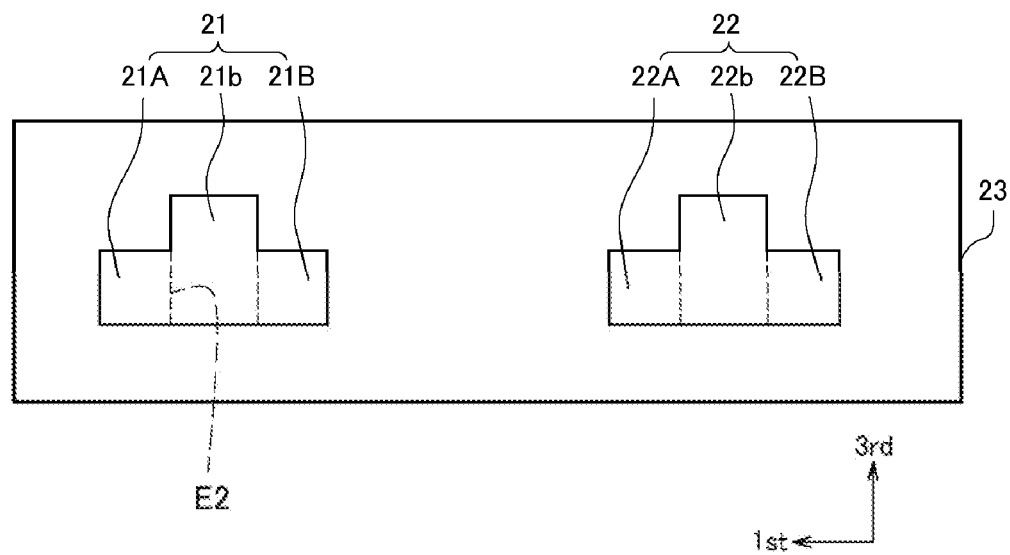
FIG. 5B is a schematic plan view of a mounting substrate used in the light source device of FIG. 5A.

As shown in FIG. 5B, the mounting substrate 23 includes, for example, the first wiring 21 and the second wiring 22 on a plate-shaped base material. The first wiring 21 and the second wiring 22 are configured to be electrically connected to the first outer lead portion 11 and the second outer lead portion 12 of the light emitting device, respectively, and are disposed corresponding to the positions of the first outer lead portion 11 and the second outer lead portion 12 of the light emitting device. That is, the first wiring 21 and the second wiring 22 are spaced apart from each other in the first direction.

Figure 5C:
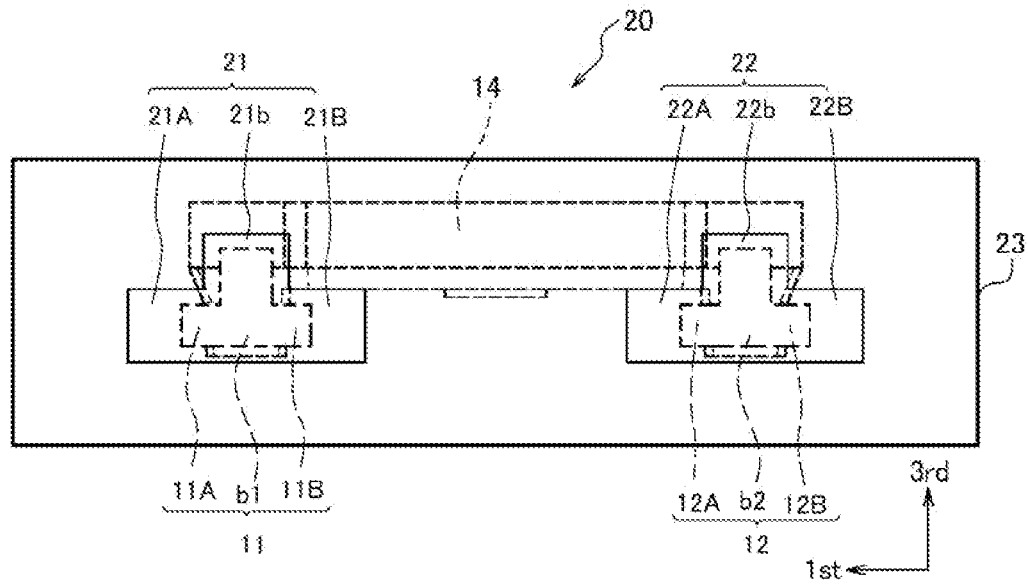
FIG. 5C is a schematic bottom view of the light emitting device of FIG. 5A, illustrating positional relationship between a first wiring and a second wiring and a first outer lead and a second outer lead.
Figure 5D:
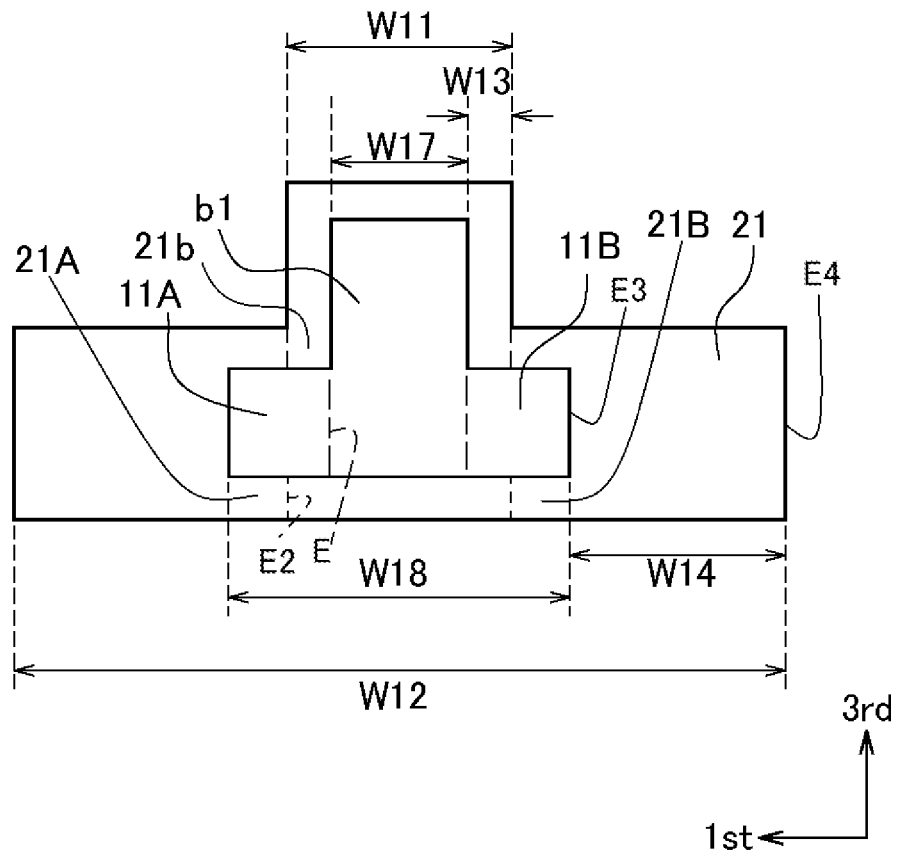
FIG. 5D is a schematic partially enlarged view of the light source device of FIG. 5C, illustrating positional relationship between a first wiring and a second wiring and a first outer lead and a second outer lead.

As shown in FIGS. 5B to 5D, in the bottom view, the first wiring 21 includes a first-wiring portion 21b overlapped with the first-outer-lead base portion b1, a first-wiring first extended portion 21A extended from the first-wiring portion 21b to the first lateral surface S1 side and overlapped with the first-outer-lead first bent portion 11A, and a first-wiring second extended portion 21B extended from the first-wiring portion 21b to the second lateral surface S2 side and overlap the first-outer-lead second bent portion 11B.

In other words, in a top view, the first wiring 21 includes the first-wiring portion 21b extended in the third direction to be overlapped with the first-outer-lead base portion b1, the first-wiring first extended portion 21A extended from the first-wiring portion 21B in the first direction to be overlapped with the first-outer-lead first bent portion 11A, and the first-wiring second extended portion 21B extended from the first-wiring portion 21b in the first direction (but in the opposite direction to first-wiring first extended portion 21A) to be overlapped with the first-outer-lead second bent portion 11B. The first-wiring first extended portion 21A and the first-wiring second extended portion 21B are located further spaced apart from the front surface of the resin member than the first-wiring portion 21b.

The first wiring 21 includes, in the bottom view, a second wiring portion 22b is overlapped with the second-outer-lead base portion b2, a second wiring first extended portion 22A extended from the second wiring portion 22b to the first lateral surface S1 side and overlapped with the second-outer-lead first bent portion 12A, and a second wiring second extended portion 22B extended from the second wiring portion 22b to the second lateral surface S2 side and overlapped with the second-outer-lead second bent portion 12B.

In other words, the second wiring 22 preferably includes, in a top view, the second wiring portion 22b extended in the third direction to overlap with the second-outer-lead base portion b2, the second wiring first extended portion 22A extended in the first direction from the second wiring portion 22b to overlap with the second-outer-lead first bent portion 12A, and the second wiring second extended portion 22B extended from the second wiring portion 22b in the first direction to overlap with the second-outer-lead second bent portion 12B. In addition, the second wiring first extended portion 22A and the second wiring second extended portion 22B are located further spaced apart from the front surface of the resin member than the second wiring portion 22b.

With the configuration described above, when the light emitting device is mounted on the mounting substrate, that is, when the first-outer-lead base portion b1 of the light emitting device and the first-wiring portion 21b are bonded together using the bonding member 24, the bonding member 24 spreads to the first-wiring first extended portion 21A and the first-wiring second extended portion 21B and rises along the first-outer-lead first bent portion 11A and the first-outer-lead second bent portion 11B, forming a so-called fillet. Accordingly, the bonding strength between the light emitting device and the mounting substrate can be improved.

It is preferable that the first-wiring portion 21 and the second wiring portion 22 have larger planar surface areas than the planar surface areas of the first outer lead portion 11 and the second outer lead portion 12, respectively.

More specifically, as shown in FIGS. 5C and 5D, in both the first and third directions, the first-wiring portion 21b and the second wiring portion 22b have length greater than that of the first outer lead portion 11 and the second outer lead portion 12, respectively. In other words, in the bottom view, the ends (E in FIG. 5D) of the first-outer-lead base portion b1 are preferably located inward, closer to the center of the first outer lead portion 11, than the ends (E2 in FIG. 5D) of the first-wiring portion 21b. In the present embodiment, "center of the first outer lead portion 11" refers to the geometric center of the first outer Lead portion 11 in the bottom view. For example, it is preferable that the ends of the first-outer-lead base portion b1 are located, in the first direction, at a distance of W13 from the corresponding ends of the first-wiring portion 21b. It is also preferable that the end of the first-outer-lead second bent portion 11B (E3 in FIG. 5D) is located closer to the center of the first outer lead portion 11 than the end (E4 in FIG. 5D) of the first-wiring second extended portion 21B. For example, it is desirable that the end of the first-outer-lead second bent portion 11B is located, in the first direction, at a distance of W14 from an end of the first-wiring second extended portion 21B. The distance W13 and the distance W14 each refers to the smallest distance. The distance W13 may be similar to the distance W14, but in a bottom view, the distance W13 is preferably less than the distance W14, i.e., W13<W14. With the arrangement as described above, when the light emitting device is bonded to the mounting substrate 23 through the bonding member, the fillet shape of the bonding member can be easily formed at portions applied on the first-outer-lead first bent portion 11A and the first-outer-lead second bent portion 11B. Furthermore, with the distance W13 smaller than the distance W14, self-alignment effect of the bonding member can be exerted efficiently, thereby reducing the displacement of the light emitting device to the mounting substrate 23.

The distance W13 and the distance W14 can be set appropriately according to the size of the light emitting device, the size and shape of the first and second outer lead portions 11 and 12. For example, the distance W13 can be in a range of 1/50 to 1/2 of the length of the first-outer-lead base portion b1 in the first direction. More specifically, when the length of the first-outer-lead base portion b1 in the first direction is in a range of 200 to 500 μm, the distance W13 can be in a range of 5 to 100 μm. The distance W14 can be in a range of 2 to 200 times of the W13. More specifically, the distance W14 can be in a range of 50 μm to 2 mm.

Also, as shown in FIG. 5D, the greatest length W11 of the first-wiring portion 21b of the first wiring 21 in the first direction can be, for example, in a range of 1.1 to 2 times of the greatest length W17 of the first-outer-lead base portion base portion b1 in the first direction. More specifically, the length W11 can be in a range of 220 μm to 1 nm. Also, the greatest length W12 of the first wiring 21 in the first direction can be, for example, in a range of 1.2 to 3 times of the greatest length W18 of the first outer lead portion 11 in the first direction. More specifically, the length W12 can be in a range of 500 μm to 5 nm.

It is preferable that the second wiring 22 has dimensions with respect to the length of the second outer lead portion in the first direction a similar to that of the first wiring 21 with respect to the length of the first outer lead portion 11.

With the relationship between the outer lead portions of the light emitting device and the wirings of the mounting substrate 23 as described above, an appropriate amount of contact area between the bonding member and the outer lead portions can be securely obtained when the light emitting device is bonded to the mounting substrate 23 through the bonding member to be described below, and accordingly can improve the bonding strength. In addition, when the lengths W11 and W12 in the first direction differ, self-alignment effect of the bonding member of the light emitting device can be exerted effectively, and misalignment can be reduced or prevented. Further, a greater length W12 facilitates forming of fillets with the bonding member.

It is preferable that the relationship between the lengths W13 and W14 can be applied similarly for the second outer lead portion 12 and the second wiring 22.

Examples of the material of the base member include a glass epoxy resin, a ceramic, and a polyimide resin 1. Examples of the material of the first wiring 21 and the second wiring 22 include copper, gold, silver, nickel, palladium, tungsten, chromium, titanium, and alloys of those metals, which can be applied in a single layer structure or a multilayer structure. The first wiring 21 and the second wiring 22 can be disposed by using technique such as plating, multi-layer pressure bonding, vapor deposition, or etching.

Bonding Member

The bonding member 24 is configured to electrically connect the first lead and second lead of the light emitting device to the first wire 21 and the second wire 22, respectively. For the bonding member 24, any known material in the art can be used. Examples of the material of the bonding member include a solder material such as a tin-bismuth-based solder material, a tin-copper-based solder material, and a tin-silver-based solder material (more specifically, an alloy with Ag, Cu, and Sn as its main components, an alloy with Cu and Sn as its main components, an alloy with Bi and Sn as its main components, etc.), a eutectic alloy (an alloy with Au and Sn as its main components, an alloy with Au and S1 as its main components, an alloy with Au and Ge as its main components, etc.), an electrically conductive paste of silver, gold, or palladium, a bump, an anisotropic conductive material, and a brazing material such as a low-melting-point metal.

Variational Example 1 of Light Source Device

Figure 6A:
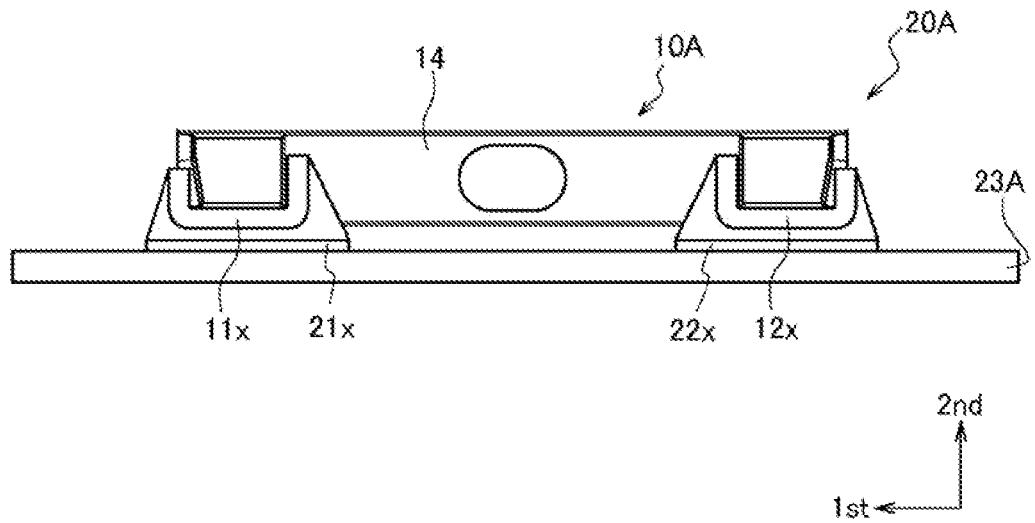
FIG. 6A is a schematic back view showing a light source device according to Variational example 1 of a light source device according to one embodiment of the present disclosure.
Figure 6B:
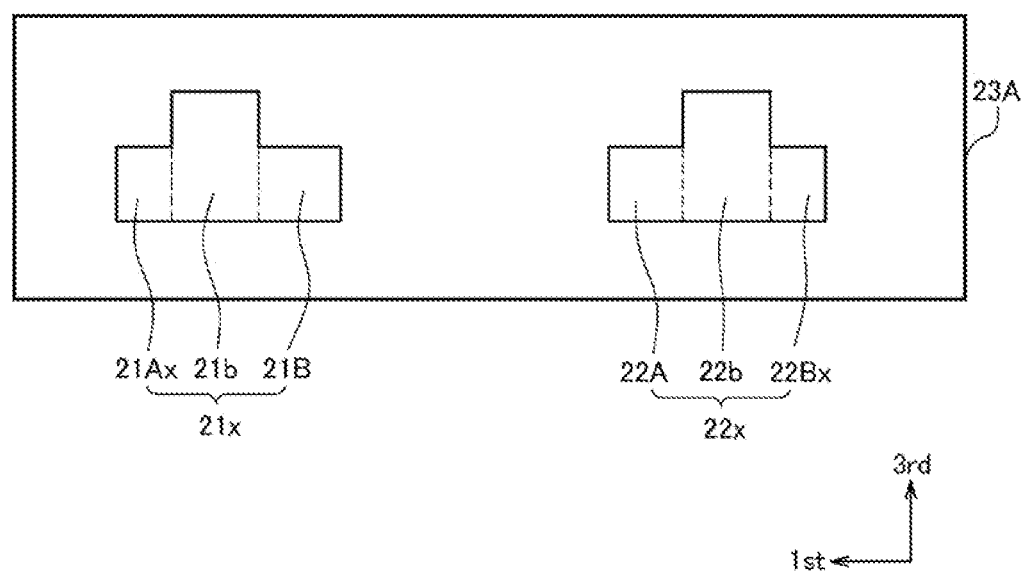
FIG. 6B is a schematic plan view of a mounting substrate of the light source of FIG. 6A.
Figure 6C:
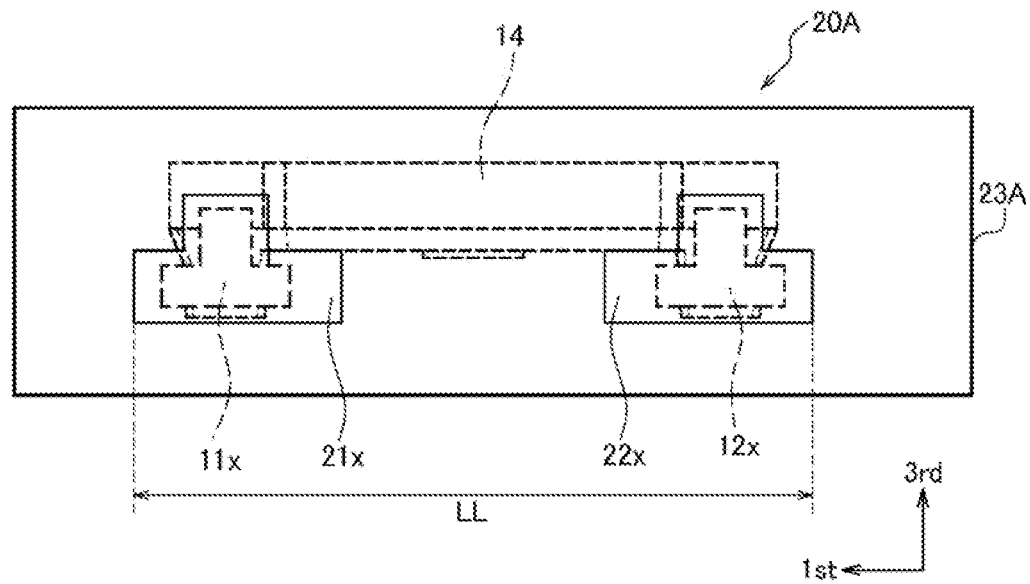
FIG. 6C is a schematic bottom view of the light source device of FIG. 6A, illustrating positional relationship between a first wiring and a second wiring and a first outer lead portion and a second outer lead portion.
Figure 6D:
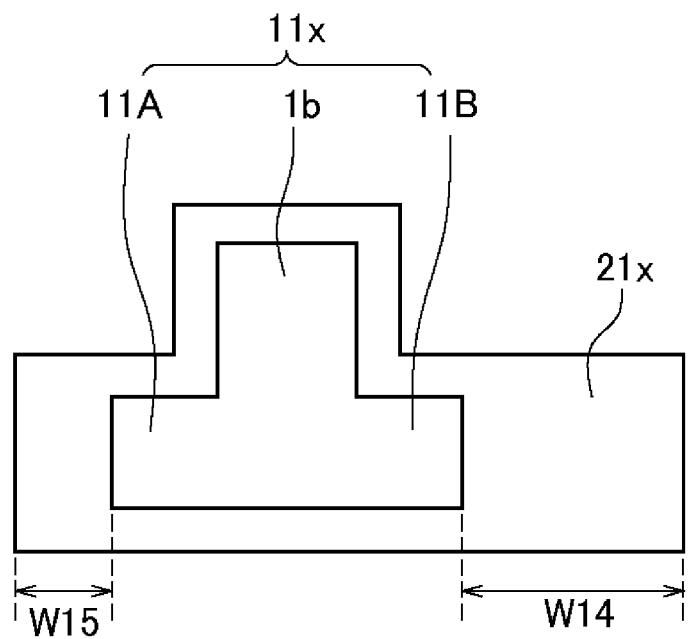
FIG. 6D is a schematic partially enlarged view FIG. 6B, illustrating positional relationship between the first wiring and the first outer lead portion.

As shown in FIG. 6D, the smallest distance W15 between an end of the first-outer-lead first bent portion 11A and an end of the first-wiring first extended portion 21Ax in the fast direction may be smaller than the smallest distance W14 between an end of the first-outer-lead second bent portion 11B and an end of the first-wiring second extended portion 21B in the first direction in a bottom view. The distance W15 can be, for example, in a range of 20 um to 1.5 mm. The distance W14 can be, for example, in a range of 1.2 to 5 times the distance of W15, which can be in a range of 20 μm to 2 mm.

It is preferable that the relationship between the distances W15 and W14 can be applied in a similar manner in the second wiring 22x and the second outer lead portion 12. In other words, in a bottom view, it is preferable that the smallest distance between an end of the second-outer-lead first bent portion 12A and an end of the second wiring first extended portion 22A in the first direction is greater than the smallest distance between an end of the second-outer-lead second bent portion 12B and an end of the second wiring second extended portion 22Bx in the first direction.

Figure 4:
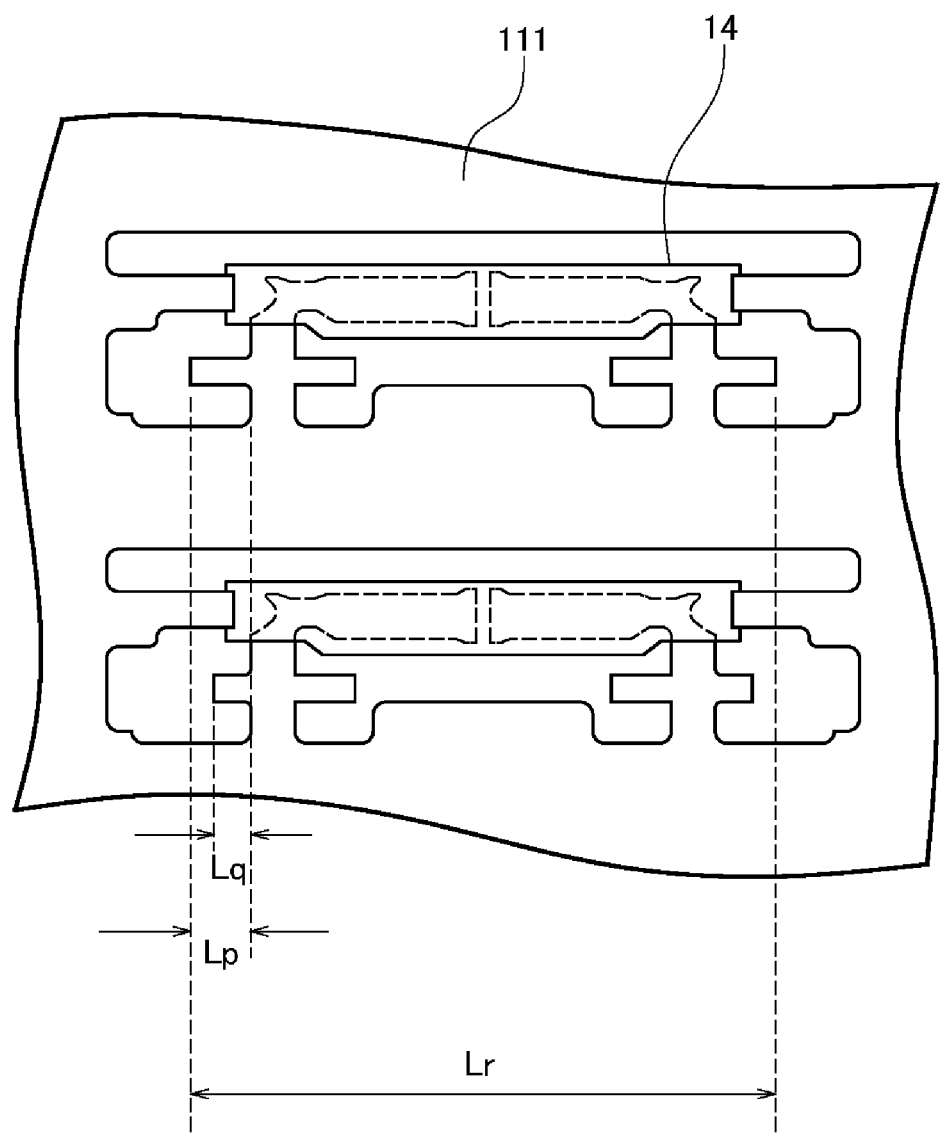
FIG. 4 is a schematic plan view of leads used for the light emitting devices of one embodiment of the present disclosure.

The arrangement described above allows a reduction of the greatest length (LL in FIG. 6C) between the first wiring 21 and the second wiring 22, inclusive of the lengths the first wiring 21 and the second wiring 22. This allows an increase of the number of the light emitting devices that can be mounted in the first direction. Even with a single light emitting device, the mounting substrate 23 can be made smaller by reducing the greatest length (LL in FIG. 6C) between the first wiring 21 and the second wiring 22, inclusive of the lengths of the first wiring 21 and the second wiring 22. In addition, when the smallest distance W15 between the end of the first-outer-lead first bent portion 11A in the first direction and an end of the first-wiring first extended portion 21Ax is smaller than the smallest distance W14 between the end of the first-outer-lead second bent portion 11B and an end of the second wiring second extended portion 21B in the first direction, the light emitting device having the lead frame 111 shown in FIG. 4 illustrated above may be mounted.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:
   at least one light emitting element;
   a resin member including,
      a front surface provided with a recess in which the at least one light emitting element is mounted,
      a back surface located on an opposite side of the front surface,
      a bottom surface adjacent to the front surface and the back surface,
      an upper surface located on an opposite side of the bottom surface,
      a first lateral surface adjacent to the bottom surface and the upper surface,
      a second lateral located on an opposite side of the first lateral surface,
      a first protruded portion protruding from the back surface in a direction away from the front surface at a position adjacent to the first lateral surface, the first protruded portion including a first-protruded-portion outer lateral surface and a first-protruded-portion inner lateral surface, and
      a second protruded portion protruding from the back surface in the direction away from the front surface at a position adjacent to the second lateral surface, the second protruded portion including a second-protruded-portion outer lateral surface and a second-protruded-portion inner lateral surface,
      the first-protruded-portion inner lateral surface facing the second-protruded-portion inner lateral surface;
   a first lead including a first inner lead portion covered by the resin member and a first outer lead portion extending out of the resin member from the bottom surface; and
   a second lead including a second inner lead portion covered by the resin member and a second outer lead portion extending out of the resin member from the bottom surface, the second outer lead portion being spaced apart from the first outer lead portion, wherein
   the first outer lead portion includes
      a first-outer-lead base portion extending along the bottom surface,
      a first-outer-lead first bent portion extended from the first-outer-lead base portion and bent along the first-protruded-portion outer lateral surface toward an upper surface side, and
      a first-outer-lead second bent portion extending from the first-outer-lead base portion on an opposite side of the first-outer-lead first bent portion and bent along the first-protruded-portion inner lateral surface toward the upper surface side so that the first-outer-lead base portion, the first-outer-lead first bent portion, and the first-outer-lead second bent portion form a generally U-shape that partially surrounds the first protruded portion in a back view,
   the second outer lead portion includes
      a second-outer-lead base portion extending along the bottom surface,
      a second-outer-lead first bent portion extending from the second-outer-lead base portion and bent along the second-protruded-portion inner lateral surface toward the upper surface side, and
      a second-outer-lead second bent portion extending from the second-outer-lead base portion on an opposite side of the second-outer-lead first bent portion and bent along the second-protruded-portion outer lateral surface toward the upper surface side so that the second-outer-lead base portion, the second-outer-lead first bent portion, and the second-outer-lead second bent portion form a generally U-shape that partially surrounds the second protruded portion in the back view, and
   the resin member is not arranged in at least a portion of a region between the first-outer-lead second bent portion and the second-outer-lead first bent portion.

2. The light emitting device according to claim 1, wherein the resin member is not arranged in an entirety of the region between the first-outer-lead second bent portion and the second-outer-lead first bent portion.

3. The light emitting device according to claim 1, wherein a greatest height of the first-outer-lead first bent portion and a greatest height of the first-outer-lead second bent portion is substantially the same as measured in a direction from a bottom surface side to the upper surface side.

4. The light emitting device according to claim 1, wherein a greatest height of the first-outer-lead first bent portion is smaller than a greatest height of the first-outer-lead second bent portion as measured in a direction from a bottom surface side to the upper surface side.

5. The light emitting device according to claim 1, wherein a smallest distance between the first-outer-lead second bent portion and the second-outer-lead first bent portion is substantially equal to or greater than a sum of a greatest height of the first-outer-lead second bent portion as measured in a direction from a bottom surface side to the upper surface side and a greatest height of the second-outer-lead first bent portion as measured in the direction from the bottom surface side to the upper surface side.

6. The light emitting device according to claim 2, wherein a greatest height of the first-outer-lead first bent portion and a greatest height of the first-outer-lead second bent portion is substantially the same as measured in a direction from a bottom surface side to the upper surface side.

7. The light emitting device according to claim 2, wherein a greatest height of the first-outer-lead first bent portion is smaller than a greatest height of the first-outer-lead second bent portion as measured in a direction from a bottom surface side to the upper surface side.

8. The light emitting device according to claim 2, wherein a smallest distance between the first-outer-lead second bent portion and the second-outer-lead first bent portion is substantially equal to or greater than a sum of a greatest height of the first-outer-lead second bent portion as measured in a direction from a bottom surface side to the upper surface side and a greatest height of the second-outer-lead first bent portion as measured in the direction from the bottom surface side to the upper surface side.

9. A light source device comprising:
the light emitting device according to claim 1; and
a mounting substrate having a first wiring and a second wiring respectively electrically connected to the first lead and the second lead, wherein
the first wiring and the second wiring are spaced apart from each other in a first direction, and
the first wiring includes, in a bottom view,
 a first-wiring portion overlapping with the first-outer-lead base portion,
 a first-wiring first extended portion extending from the first-wiring portion toward a first lateral surface side and overlapping with the first-outer-lead first bent portion, and
 a first-wiring second extended portion extending from the first-wiring portion toward a second lateral surface side and overlapping with the first-outer-lead second bent portion.

10. The light source device according to claim 9, wherein in a bottom view, a smallest distance between an end of the first-outer-lead base portion to an end of the first-wiring portion in the first direction is smaller than a smallest distance between an end of the first-outer-lead second bent portion to an end of the first-wiring second extended portion in the first direction.

11. The light source device according to claim 9, wherein, in a bottom view, a smallest distance between an end of the first-outer-lead first bent portion to an end of the first-wiring first extended portion in the first direction is smaller than a smallest distance between an end of the first-outer-lead second bent portion to an end of the first-wiring second extended portion in the first direction.

12. A light source device comprising:
the light emitting device according to claim 2; and
a mounting substrate having a first wiring and a second wiring respectively electrically connected to the first lead and the second lead, wherein
the first wiring and the second wiring are spaced apart from each other in a first direction, and
the first wiring includes, in a bottom view,
 a first-wiring portion overlapping with the first-outer-lead base portion,
 a first-wiring first extended portion extending from the first-wiring portion toward a first lateral surface side and overlapping with the first-outer-lead first bent portion, and
 a first-wiring second extended portion extending from the first-wiring portion toward a second lateral surface side and overlapping with the first-outer-lead second bent portion.

13. The light source device according to claim 12, wherein
in a bottom view, a smallest distance between an end of the first-outer-lead base portion to an end of the first-wiring portion in the first direction is smaller than a smallest distance between an end of the first-outer-lead second bent portion to an end of the first-wiring second extended portion in the first direction.

14. The light source device according to claim 12, wherein,
in a bottom view, a smallest distance between an end of the first-outer-lead first bent portion to an end of the first-wiring first extended portion in the first direction is smaller than a smallest distance between an end of the first-outer-lead second bent portion to an end of the first-wiring second extended portion in the first direction.

\* \* \* \* \*